(12) United States Patent
Kalavade et al.

(10) Patent No.: US 9,484,101 B2
(45) Date of Patent: Nov. 1, 2016

(54) METHODS OF PROGRAMMING MEMORIES (71) Applicant: MICRON TECHNOLOGY, INC., Boise, ID (US)

(72) Inventors: Pranav Kalavade, San Jose, CA (US); Akira Goda, Boise, ID (US); Tommaso Vali, Latina (IT); Violante Moschiano, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/822,083

(22) Filed: Aug. 10, 2015

(65) Prior Publication Data

US 2015/0380091 A1 Dec. 31, 2015

Related U.S. Application Data

(63) Continuation of application No. 14/199,304, filed on Mar. 6, 2014, now Pat. No. 9,105,337, which is a continuation of application No. 13/051,599, filed on Mar. 18, 2011, now Pat. No. 8,681,562.

(60) Provisional application No. 61/431,208, filed on Jan. 10, 2011.

(51) Int. Cl.
*G11C 16/04* (2006.01)
*G11C 16/10* (2006.01)
(Continued)

(52) U.S. Cl.
CPC ........... *G11C 16/10* (2013.01); *G11C 11/5628* (2013.01); *G11C 16/3454* (2013.01); *G11C 16/3459* (2013.01)

(58) Field of Classification Search
CPC .............. G11C 16/10; G11C 16/3409; G11C 16/3445; G11C 29/50004
See application file for complete search history.

(56) References Cited

U.S. PATENT DOCUMENTS 5,892,710 A 4/1999 Fazio et al.
6,307,784 B1 10/2001 Hamilton et al.
(Continued)

FOREIGN PATENT DOCUMENTS

TW 200849250 12/2008
TW 200907975 2/2009
(Continued)

OTHER PUBLICATIONS

TW Office Action for ROC (Taiwan) Patent Application No. 101100972, issued Mar. 10, 2015, 8 pages.

*Primary Examiner* — Tuan T Nguyen
(74) *Attorney, Agent, or Firm* — Dicke, Billig & Czaja, PLLC (57) ABSTRACT

Methods of programming memories include applying a first plurality of programming pulses to the group of memory cells to program first data to the group of memory cells, determining an upper limit of a resulting threshold voltage distribution for the group of memory cells following a particular programming pulse of the first plurality of programming pulses, and applying a second plurality of programming pulses to the group of memory cells to program second data to the group of memory cells, wherein a characteristic of at least one of the programming pulses of the second plurality of programming pulses is at least partially based on the determined upper limit of the threshold voltage distribution. Methods of programming memories further include programming information indicative of usage of memory cells of a page of memory cells to the page of memory cells during a portion of a programming operation.

27 Claims, 4 Drawing Sheets (51) Int. Cl.
*G11C 11/56* (2006.01)
*G11C 16/34* (2006.01)

(56) References Cited

U.S. PATENT DOCUMENTS

| | | |
|---|---|---|
| 6,798,698 B2 | 9/2004 | Tanaka et al. |
| 6,807,100 B2 | 10/2004 | Tanaka |
| 7,450,421 B2 | 11/2008 | Mokhlesi et al. |
| 7,457,178 B2 | 11/2008 | Tu et al. |
| 7,606,091 B2 | 10/2009 | Li et al. |
| 7,679,961 B2 | 3/2010 | Lee et al. |
| 8,036,034 B2 | 10/2011 | Shiga et al. |
| 8,605,504 B2 | 12/2013 | Okamoto |
| 2003/0147286 A1 | 8/2003 | Tanaka et al. |
| 2007/0279994 A1 | 12/2007 | Mokhlesi et al. |
| 2008/0175064 A1 | 7/2008 | Wang |
| 2010/0097861 A1 | 4/2010 | Dutta et al. |
| 2010/0208523 A1 | 8/2010 | Marquart |
| 2010/0246265 A1 | 9/2010 | Moschiano et al. |
| 2010/0302860 A1 | 12/2010 | Oh |
| 2010/0302864 A1 | 12/2010 | Kim et al. |
| 2011/0007562 A1 | 1/2011 | Yip |
| 2012/0176843 A1* | 7/2012 | Kalavade ............ G11C 11/5628 365/185.19 |
| 2012/0327710 A1* | 12/2012 | He ......................... G11C 16/30 365/185.2 |
| 2013/0250677 A1* | 9/2013 | Nam .................... G11C 13/0002 365/185.03 |
| 2015/0063028 A1 | 3/2015 | Raghu et al. |
| 2015/0357041 A1* | 12/2015 | Jang .................... G11C 11/5628 365/185.03 |

FOREIGN PATENT DOCUMENTS

| | | |
|---|---|---|
| TW | 200917259 | 4/2009 |
| TW | 201015555 | 4/2010 |
| TW | 201025342 | 7/2010 |

\* cited by examiner

METHODS OF PROGRAMMING MEMORIES

RELATED APPLICATIONS

This application is a continuation of U.S. patent application Ser. No. 14/199,304, filed on Mar. 6, 2014, titled "MEMORIES AND METHODS OF PROGRAMMING MEMORIES," (now U.S. Pat. No. 9,105,337), which is a continuation of U.S. patent application Ser. No. 13/051,599, filed on Mar. 18, 2011, titled "MEMORIES AND METHODS OF PROGRAMMING MEMORIES," (now U.S. Pat. No. 8,681,562), which claims priority to U.S. Provisional Application No. 61/431,208, filed on Jan. 10, 2011, titled "MEMORIES AND METHODS OF PROGRAMMING MEMORIES," which are commonly owned and are incorporated herein by reference in their entireties.

FIELD

The present disclosure relates generally to memories, and in particular, in one or more embodiments, the present disclosure relates to programming of memories.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage node (e.g., a floating gate or charge trap), or other physical phenomena (e.g., phase change or polarization), determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as bit lines. In NAND flash architecture, a column of memory cells is coupled in series with only the first memory cell of the column coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Multilevel cells can take advantage of the analog nature of a traditional flash cell by assigning a data state, e.g., a bit pattern, to a specific threshold voltage (Vt) range of the cell. This technology permits the storage of two or more bits of information per cell, depending on the quantity of voltage ranges assigned to the cell and the stability of the assigned voltage ranges during the lifetime operation of the memory cell.

The voltage necessary to program (or erase) a cell is highly dependent on the usage of the cell, such as the number of times that the particular cell has been programmed and/or erased (cycled) in the past. A cell that has been through no or very few program/erase cycles will typically require application of a higher voltage at its gate to raise its threshold voltage by a particular amount as compared to a cell that has been through a higher number of cycles.

For example, a cell that that never been programmed before can be programmed with an initial program voltage that is relatively high compared to a cell that has been cycled many (on the order of thousands) times. A cell that has been cycled many times will have its threshold voltage moved a larger amount by the same program pulse than a cell that has not previously been cycled, or has been cycled only a few times. If a high initial program voltage is used for a cell that has been cycled many times, the threshold voltage of the cell may change so much that the cell overshoots its desired threshold voltage even on an initial program pulse. Therefore, using a high initial program voltage pulse could over program a highly cycled cell. A relatively low initial program voltage will move the threshold voltage of an uncycled or lightly cycled cell a small amount relative to the amount that same pulse would move a highly-cycled cell. Therefore, using a low initial program voltage pulse could result in longer program times for uncycled or nearly uncycled cells, since more program pulses would be needed to allow the cell to reach its target threshold voltage.

For reasons such as those stated above, and for other reasons, such as those stated below, which will become apparent to those skilled in the art upon reading and understanding the present specification, there is a need in the art for, among other things, improving programming for memories.

DETAILED DESCRIPTION

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

One or more embodiments of the present disclosure are directed to adjustment of programming operations at least partially based on usage as determined at least partially based on a result of at least an initial programming pulse. As memory cells are cycled more and more times, the same amount of program voltage applied to a control gate of the cell will move the threshold voltage of the cell more the more time the cell has cycled.

Because of the difference in the speed of programming for cells that are relatively uncycled versus cells that have been cycled many times, in one embodiment, a programming time for a memory page can be reduced by adjusting an initial program voltage applied to the cell so that it reaches its target threshold voltage using fewer programming pulses. For example, a relatively lower initial pulse program voltage might be used for upper page programming of a cell that has been cycled many times, so as not to overshoot its desired threshold voltage. Meanwhile, a relatively higher initial pulse program voltage might be used for upper page programming of a cell that is uncycled or has a low number of cycles.

Since NAND memory is programmed on a per page basis, each cell of a page has been cycled a same number of times. A number of times a page has been cycled also provides a number of times each cell of the page has been cycled. Cycle counters on each page of the memory take up die space, additional processing time, and storage space. Further, a page cycle counter cannot account for differences in cell performance based on factors other than a number of cycles the page has been through, for example, fabrication factors and the like.

Figure 1:
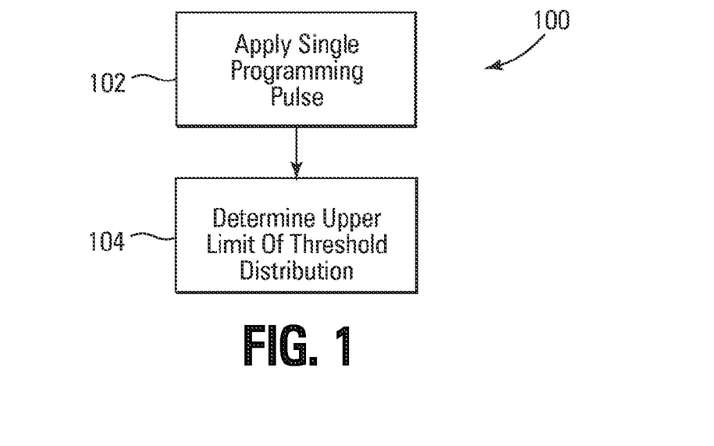
FIG. 1 is a diagram showing a graphical representation of programming a memory according to one embodiment of the present disclosure.

In the present disclosure, an estimation of page cycling is made using a method such as method 100 of FIG. 1. Method 100 comprises in one embodiment applying a single program pulse at a relatively low program voltage at a start of lower page programming for a page in block 102, and determining an upper limit of a resulting cell threshold voltage distribution for cells on the page in block 104. If the page is uncycled or very lightly cycled, the low voltage pulse will not cause much of a shift in the distribution. If the page is heavily cycled, the low voltage pulse will cause a larger shift in the threshold voltage distribution. In one embodiment, a characteristic(s) the initial program pulse voltage is determined as a value defined by fuses of the memory device.

Figure 2:
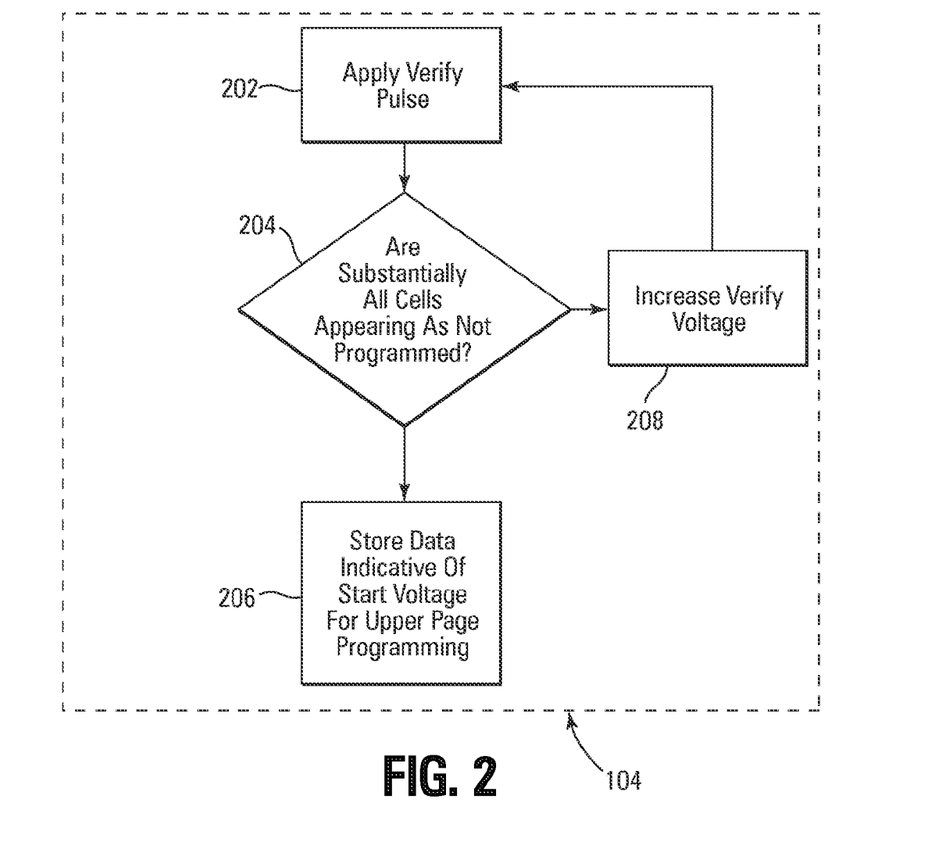
FIG. 2 is a flow chart diagram of a method according to an embodiment of the present disclosure.

An upper limit of the cell threshold voltage distribution for the page (block 104) is determined in one embodiment as shown in further detail in FIG. 2. After the initial pulse is applied in block 102, block 104 as shown in FIG. 2 further comprises applying a verify pulse to the page in block 202, and after each verify pulse, determining whether substantially all of the cells of the page are not programmed in decision block 204, that is, the number of cells above the verify itself. The verify level which satisfies the condition about the number of cells is stored in block 206 to indicate an initial voltage to be applied when upper page programming for the page is performed. If a number of cells higher than a determined, trimmable number of cells of the page appear as programmed (e.g., to accommodate for fast programming cells), the verify voltage is increased in block 208, and another verify pulse is applied in block 202 followed by a check in block 204, until the number of cells appearing as a logical 0 is substantially all of the cells of the page. In one embodiment, the upper limit of the threshold voltage distribution for the page is determined by a determination that all but approximately fifteen cells less than the total number of cells on the page are verified as unprogrammed cells.

In one embodiment, upper page programming of a page of cells is started at an initial voltage determined (e.g., set or calculated) based on the verify voltage used when substantially all of the cells of the page are verified as unprogrammed cells. In one embodiment, the initial voltages for upper page programming are based on the upper limit of the threshold voltage distribution of the page after the initial programming pulse of the lower page programming operation.

The process of block 206 is accomplished in one embodiment by writing the voltage of the verify pulse applied immediately before the verify pulse after which substantially all of the cells of the page appear unprogrammed, along with an associated initial program voltage for upper page programming, in a storage location (e.g., in the same page of cells) during the lower page program operation after the initial program pulse for the lower page programming operation. The initial program voltage is in one embodiment determined based on known factors, such as a difference in target threshold voltage between the upper page and the lower page, or the like. Such initial program voltages are in one embodiment programmed into a register or other storage as part of the programming of the lower page. In one example, a two-byte flag field within the page of cells is programmed with data determined from the initial program pulse and sequence of verify pulses. This information, programmed during the lower page programming, is available to be read before upper page programming is started, to determine an initial program voltage for upper page programming.

Figure 3:
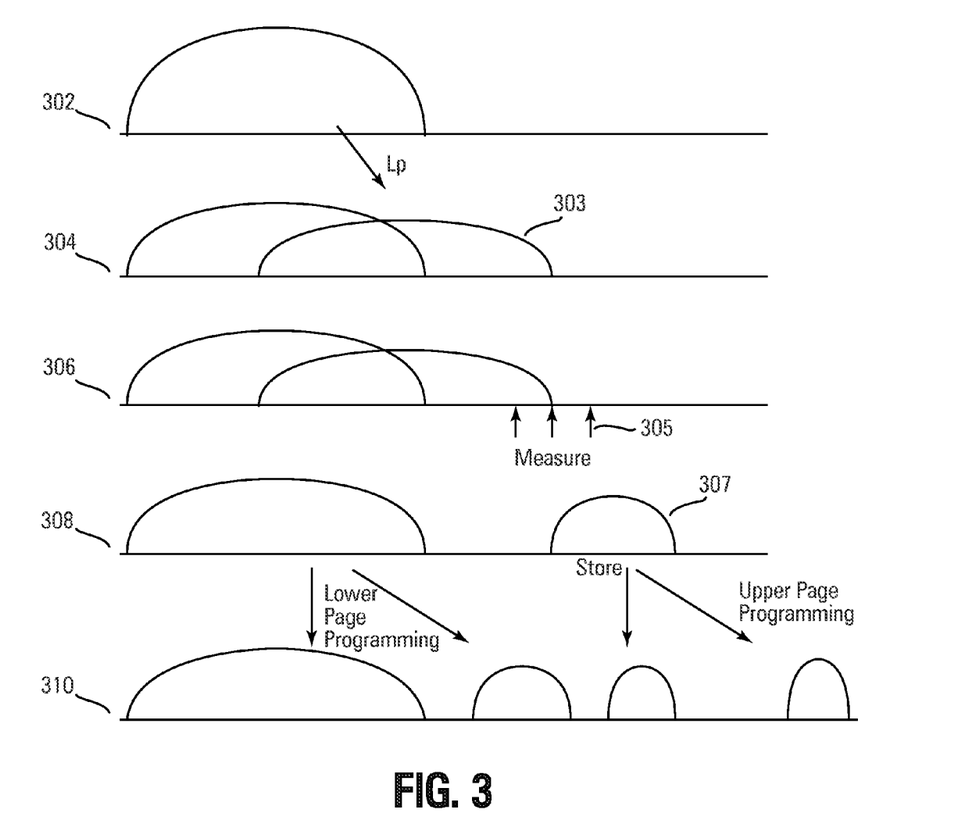
FIG. 3 is a flow chart diagram of further detail of a method according to the embodiment of FIG. 2.

FIG. 3 shows graphically one embodiment of a programming method, described herein with respect to FIGS. 1-2. In line 302, a threshold voltage distribution of a page of memory cells prior to lower page programming is shown. In line 304, a threshold voltage distribution 303 for the page is shown after application of an initial program pulse during lower page programming is shown. The verify pulses in line 306, identified as pulses 305, are used to determine the upper limit of the threshold voltage distribution 303. In line 308, the data indicative of the determined upper limit of the threshold voltage distribution for the lower page is stored as part of the lower page programming operation that results the distribution of cells depicted in line 308. In line 310, the distribution of the cells of the page are shown after upper page programming is completed programming is completed.

Variations of the cells on the page, including word line to word line variations, block to block variations, and also process variations, can all be taken into account using the methods disclosed herein. Instead of counting cycles of a page and estimating an effect of the amount of cycles, a direct physical measure, that is the physical threshold voltage distribution of the particular page being programmed, can be used to adjust upper page programming.

It is possible that a particular pattern of nearly erased data to be programmed into the page during lower page programming could potentially be problematic in a page that has been cycled many times, namely by causing an initial pulse for upper page programming to be too high. However, a randomizer circuit could be used with the programming of the page to alleviate that potential problem.

In one embodiment, multiple data values for initial program voltages for upper page programming may be stored in a separate location, and a selected initial program voltage for upper page programming is applied depending upon the verify voltage at which the upper limit of the threshold voltage distribution for the lower page programming first pulse is determined. For example, verify pulses are applied at a plurality of different increasing voltages to determine the upper limit of the threshold voltage distribution. If the upper limit of the threshold voltage distribution is determined to be at the first verify pulse, a first data set having data for upper page programming is used. If the upper limit of the threshold voltage distribution is determined to be at the second verify pulse, a second data set having data for upper page programming is used, and so on. In this embodiment, the voltages in the data sets can be determined based on known history, or can be determined based on the actual voltage applied for the verify pulse.

For example, each verify voltage might have an associated initial programming voltage that is stored in the data programmed with the lower page programming, and used for the upper page programming. In one embodiment, these data sets are trimmable as well.

Figure 4:
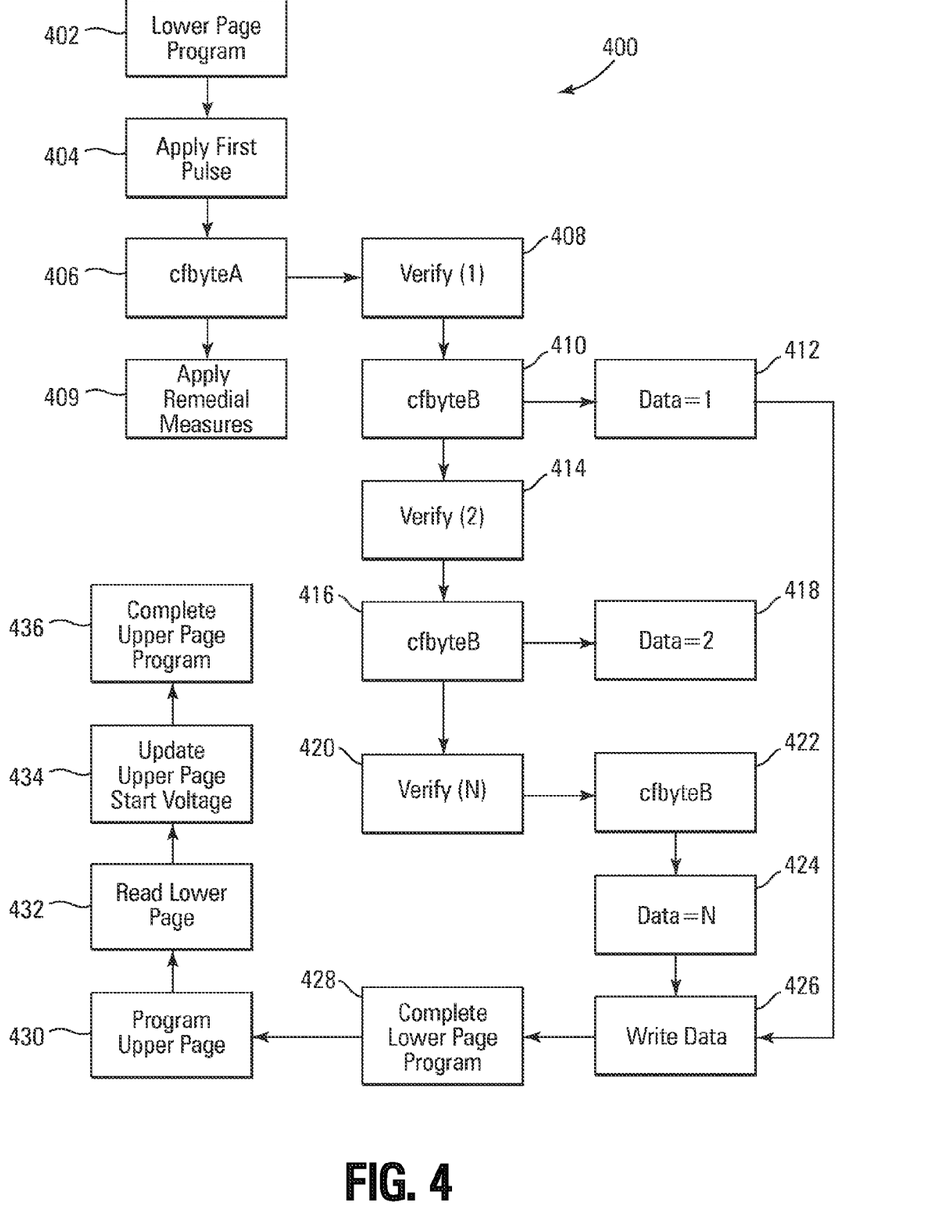
FIG. 4 is a flow chart of further detail of a method according to another embodiment of the present disclosure.

A detailed flow chart of one embodiment 400 for implementing the methods described herein is shown in FIG. 4. A program lower page command is issued at block 402. At block 404, an initial program pulse is applied as part of a first (e.g., lower page) programming operation where, in an embodiment, the voltage used is set by fuses. Following the program pulse at block 404, a first count fail byte (cfbyteA) operation is run at block 406 to determine whether the data pattern resulting from the first program pulse is random enough that operation can continue. If not, remedial measures can be taken in block 409 to make sure the page is suitable for verification. The cfbyte operation indicates whether a trimmable criteria of a number of bits to be programmed has been reached. If the pattern is random enough, a first verify pulse is applied at a first voltage level at block 408, followed by a second cfbyte operation (cfbyteB) at block 410 to determine whether substantially all of the cells indicate as unprogrammed. If substantially all of the cells are indicated as unprogrammed, data associated with the first verify voltage are written at block 412, and operation continues at block 426. If not, a second verify pulse is applied at a second voltage level at block 414, followed by another cfbyteB operation at block 416 to determine whether substantially all of the cells indicate as unprogrammed. If substantially all of the cells are indicated as unprogrammed, data associated with the second verify voltage are written at block 418, and operation continues at block 426. If not, subsequent verify voltages are applied (in one embodiment four, but a different number N could be used), followed by cfbyteB operations, and writing of data associated with the respective verify voltage level, until an Nth verify voltage is applied at block 420, followed by a cfbyteB operation at block 422, and writing data associated with the Nth verify voltage level at block 424.

In block 426, the data associated with the verify voltage level at which substantially all of the cells indicate as unprogrammed is written to a flag storage area in the lower page, and lower page programming is completed at block 428. Upper page programming is begun at block 430. Lower page programming usage data, e.g., indicating how fast or slow the lower page programmed and/or indicating a number of times the cells of the page have been programmed and/or erased, is therefore written into the lower page. When an upper page program operation is begun, the lower page can be read at block 432 to obtain the stored data. The stored data is used to adjust and initial program voltage for the upper page programming in block 434, and a sequence of programming/verify pulses (block 436) used to program the upper page, starting at a voltage based on the data written into the lower page.

Figure 5:
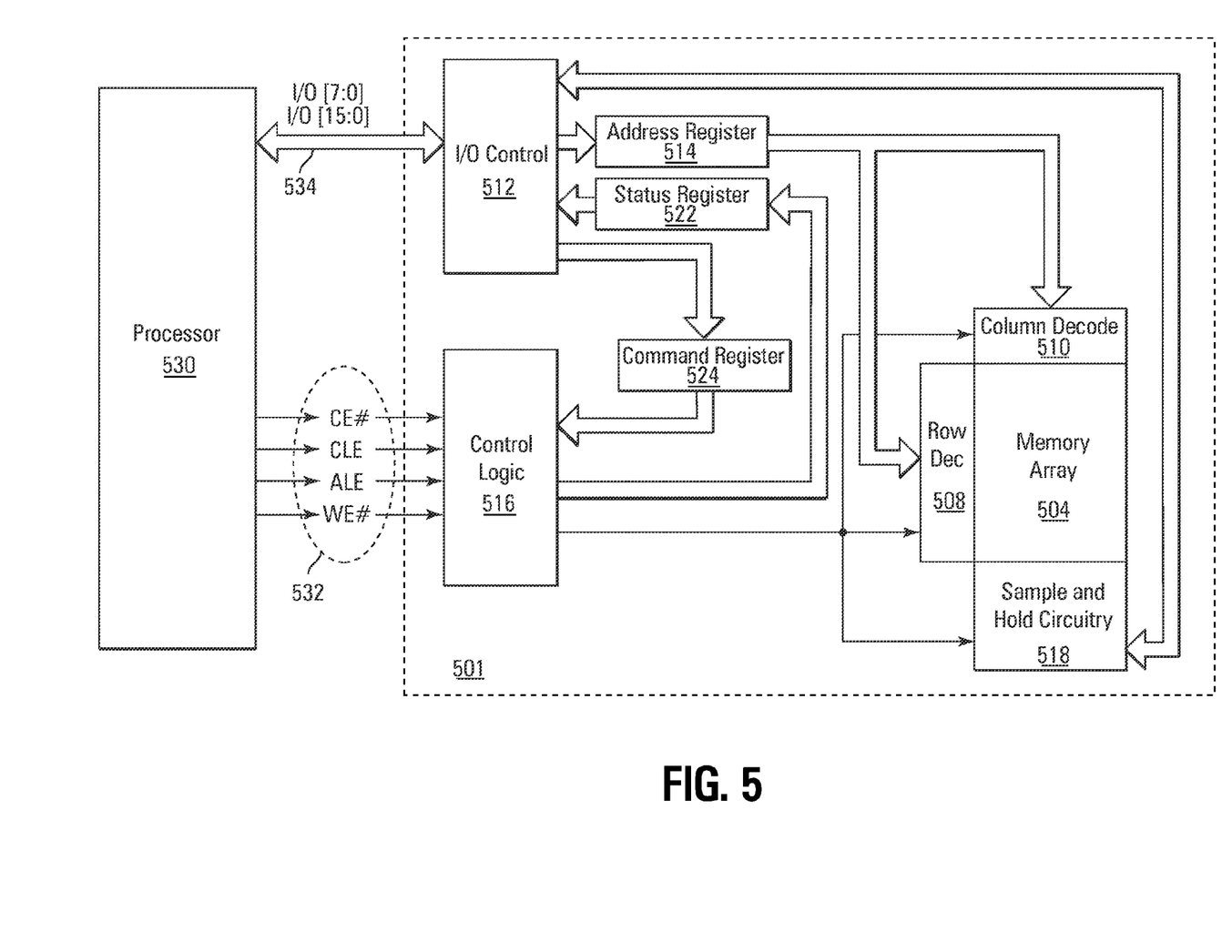
FIG. 5 is a block diagram of an electrical system according to an embodiment of the present disclosure.

FIG. 5 is a simplified block diagram of a memory device 501 according to an embodiment of the disclosure, and on which various embodiments of the disclosure can be practiced. Memory device 501 includes an array of memory cells 504 arranged in rows and columns. Although the various embodiments will be described primarily with reference to NAND memory arrays, the various embodiments are not limited to a specific architecture of the memory array 504. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 508 and a column decode circuitry 510 are provided to decode address signals provided to the memory device 501. Address signals are received and decoded to access memory array 504. Memory device 501 also includes input/output (I/O) control circuitry 512 to manage input of commands, addresses and data to the memory device 501 as well as output of data and status information from the memory device 501. An address register 514 is coupled between I/O control circuitry 512 and row decode circuitry 508 and column decode circuitry 510 to latch the address signals prior to decoding. A command register 524 is coupled between I/O control circuitry 512 and control logic 516 to latch incoming commands. Control logic 516 controls access to the memory array 504 in response to the commands and generates status information for the external processor 530. The control logic 516 is coupled to row decode circuitry 508 and column decode circuitry 510 to control the row decode circuitry 508 and column decode circuitry 510 in response to the addresses.

Control logic 516 can be coupled to a sample and hold circuitry 518. The sample and hold circuitry 518 latches data, either incoming or outgoing, in the form of analog data signals. For example, the sample and hold circuitry could contain capacitors or other analog storage devices for sampling either an incoming data signal representing data to be written to a memory cell or an outgoing data signal indicative of the threshold voltage sensed from a memory cell. The sample and hold circuitry 518 may further provide for amplification and/or buffering of the sampled signal to provide a stronger data signal to an external device.

The handling of analog data signals may take an approach similar to an approach well known in the area of CMOS imager technology, where charge levels generated at pixels of the imager in response to incident illumination are stored on capacitors. These charge levels are then converted to signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a data signal indicative of an actual or target threshold voltage of a memory cell for reading or programming, respectively, the memory cell. This charge could then be converted to an analog data signal using a differential amplifier having a grounded input or other reference signal as a second input. The output of the differential amplifier could then be passed to the I/O control circuitry 512 for output from the memory device, in the case of a read operation, or used for comparison during one or more verify operations in programming the memory device. It is noted that the I/O control circuitry 512 could optionally include analog-to-digital conversion functionality and digital-to-analog conversion (DAC) functionality to convert read data from an analog data signal to a digital bit pattern and to convert write data from a digital bit pattern to an analog signal such that the memory device 501 could be adapted for communication with either an analog or digital data interface.

During a programming operation, target memory cells of the memory array 504 are programmed until voltages indicative of their Vt levels match the levels held in the sample and hold circuitry 518. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 518 for transfer to an external processor (not shown in FIG. 5) either directly as analog signals or as digitized representations of the analog signals depending upon whether ADC/DAC functionality is provided external to, or within, the memory device.

Threshold voltages of cells may be determined in a variety of manners. For example, an access line, such as those typically referred to as word lines, voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 518 may include caching, i.e., multiple storage locations for each data value, such that the memory device 501 may be reading a next data value while passing a first data value to the external processor, or receiving a next data value while writing a first data value to the memory array 504. A status register 522 is coupled between I/O control circuitry 512 and control logic 516 to latch the status information for output to the external processor.

Memory device 501 receives control signals at control logic 516 over a control link 532. The control signals may include a chip enable CE#, a command latch enable CLE, an address latch enable ALE, and a write enable WE#. Memory device 501 may receive commands (in the form of command signals), addresses (in the form of address signals), and data (in the form of data signals) from an external processor over a multiplexed input/output (I/O) bus 534 and output data to the external processor over I/O bus 534.

In a specific example, commands are received over input/output (I/O) pins [7:0] of I/O bus 534 at I/O control circuitry 512 and are written into command register 524. The addresses are received over input/output (I/O) pins [7:0] of bus 534 at I/O control circuitry 512 and are written into address register 514. The data may be received over input/output (I/O) pins [7:0] for a device capable of receiving eight parallel signals, or input/output (I/O) pins [15:0] for a device capable of receiving sixteen parallel signals, at I/O control circuitry 512 and are transferred to sample and hold circuitry 518. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 5 has been simplified to help focus on the embodiments of the disclosure.

Methods for adjusting initial program voltages for upper page programming of a memory may be performed in various embodiments on a memory such as memory 500. Such methods are shown and described herein with reference to FIGS. 1-4.

While FIG. 5 has been described with respect to sample and hold circuitry 518, it should be understood that the control logic 516 could be coupled to data latches instead of sample and hold circuitry 518 without departing from the scope of the disclosure. Data latches latch data, either incoming or outgoing. During a write operation, target memory cells of the memory array 504 are programmed, for example using two sets of programming pulses as described above, until voltages indicative of their Vt levels match the data held in the data latches. This can be accomplished, as one example, using differential sensing devices to compare the held data to a threshold voltage of the target memory cell.

Additionally, while the memory device of FIG. 5 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 534. Because the data signals represent bit patterns instead of individual bits, serial communication of an 8-bit data signal could be as efficient as parallel communication of eight signals representing individual bits.

CONCLUSION

Methods and apparatus have been described that adjust, for example, upper page programming in a memory at least partially based on a determined usage of the page of cells, such as based on a threshold voltage distribution resulting from a single programming pulse during lower page programming.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of programming a memory, comprising:
    applying a first plurality of programming pulses to the group of memory cells to program first data to the group of memory cells;

determining an upper limit of a resulting threshold voltage distribution for the group of memory cells following a particular programming pulse of the first plurality of programming pulses; and applying a second plurality of programming pulses to the group of memory cells to program second data to the group of memory cells, wherein a characteristic of at least one of the programming pulses of the second plurality of programming pulses is at least partially based on the determined upper limit of the threshold voltage distribution.

2. The method of claim 1, wherein determining an upper limit of a threshold voltage distribution comprises:

applying a plurality of verify pulses to the group of memory cells; and determining when all but a particular number of the memory cells of the group of memory cells appear as unprogrammed memory cells.

3. The method of claim 2, wherein applying a plurality of verify pulses to the group of memory cells comprises applying a plurality of increasingly higher verify pulses to the group of memory cells.

4. The method of claim 2, wherein determining when all but a particular number of the memory cells of the group of memory cells appear as unprogrammed memory cells comprises determining when all but fifteen memory cells of the group of memory cells appear as unprogrammed memory cells.

5. The method of claim 1, wherein the particular programming pulse is an initial programming pulse of the first plurality of programming pulses.

6. The method of claim 5, wherein a voltage level of an initial programming pulse of the second plurality of programming pulses is based on the determined upper limit of the threshold voltage distribution.

7. A method of programming a memory, comprising:

applying a first plurality of programming pulses to the group of memory cells to program first data to the group of memory cells;

following applying a particular programming pulse of the first plurality of programming pulses, applying a plurality of verify pulses to the group of memory cells and determining a particular verify pulse of the plurality of verify pulses when all but a particular number of the memory cells of the group of memory cells appear as unprogrammed memory cells; and applying a second plurality of programming pulses to the group of memory cells to program second data to the group of memory cells, wherein a voltage level of a particular programming pulse of the second plurality of programming pulses is at least partially based on the determined particular verify pulse of the plurality of verify pulses when all but the particular number of the memory cells of the group of memory cells appeared as unprogrammed memory cells.

8. The method of claim 7, wherein the particular programming pulse of the first plurality of programming pulses is an initial programming pulse of the first plurality of programming pulses.

9. The method of claim 7, wherein determining a particular verify pulse of the plurality of verify pulses when all but a particular number of the memory cells of the group of memory cells appear as unprogrammed memory cells comprises determining at which verify pulse of the plurality of verify pulses a trimmable number of memory cells fewer than all of the memory cells of the group of memory cells appear as unprogrammed for that verify pulse.

10. The method of claim 7, and further comprising:

storing data for determining the voltage level of the initial programming pulse of the second plurality of programming pulses during programming of the first data to the group of memory cells.

11. The method of claim 10, wherein storing data comprises storing data associated with the particular verify pulse of the plurality of verify pulses.

12. The method of claim 10, wherein storing data comprises storing data associated with a final verify pulse of the plurality of verify pulses when no other verify pulse of the plurality of verify pulses cause all but the particular number of the memory cells of the group of memory cells to appear as unprogrammed memory cells.

13. The method of claim 10, wherein each verify pulse of the plurality of verify pulses has respective associated data.

14. The method of claim 7, wherein applying a plurality of verify pulses to the group of memory cells comprises applying a plurality of increasingly higher verify pulses to the group of memory cells until determining the particular verify pulse.

15. The method of claim 7, further comprising, if applying a final verify pulse of the plurality of verify pulses, deeming the final verify pulse of the plurality of verify pulses to be the particular verify pulse.

16. A method of programming a memory, comprising:

applying a first plurality of programming pulses to the group of memory cells to program first data to the group of memory cells;

following applying a particular programming pulse of the first plurality of programming pulses, applying a plurality of increasingly higher verify pulses until all but a particular number of the memory cells of the group of memory cells appear as unprogrammed memory cells, wherein each verify pulse of the plurality of verify pulses has associated data; and applying a second plurality of programming pulses to the group of memory cells to program the second data to the group of memory cells, wherein an initial programming pulse of the second plurality of programming pulses is applied at a voltage level determined in response to the data associated with a particular verify pulse of the plurality of increasingly higher verify pulses applied when all but the particular number of the memory cells of the group of memory cells appeared as unprogrammed memory cells.

17. The method of claim 16, wherein applying a first plurality of programming pulses to the group of memory cells to program first data to the group of memory cells comprises programming lower page data to the group of memory cells.

18. The method of claim 17, wherein applying a second plurality of programming pulses to the group of memory cells to program the first data to the group of memory cells comprises programming upper page data to the group of memory cells.

19. The method of claim 16, further comprising storing the data associated with the particular verify pulse during programming of the first data to the group of memory cells.

20. The method of claim 16, further comprising applying the initial programming pulse of the second plurality of programming pulses at a voltage level determined in response to the data associated with a highest verify pulse of the plurality of increasingly higher verify pulses if no other verify pulse of the plurality of increasingly higher verify pulses causes all but the particular number of the memory cells of the group of memory cells to appear as unprogrammed memory cells.

21. A method of programming a memory, comprising:
performing a first portion of a programming operation on a page of memory cells;
determining information indicative of a usage of memory cells of the page of memory cells during the first portion of the programming operation;
programming the information indicative of the usage of memory cells of the page of memory cells to the page of memory cells during the first portion of the programming operation;
performing a second portion of a programming operation on the page of memory cells; and
using the information indicative of the usage of memory cells of the page of memory cells to adjust a programming voltage of the second portion of the programming operation.

22. The method of claim 21, wherein performing a first portion of a programming operation comprises programming lower page data to the page of memory cells and wherein performing a second portion of a programming operation comprises programming higher page data to the page of memory cells.

23. The method of claim 22, wherein programming higher page data to the page of memory cells comprises programming middle page data to the page of memory cells or programming upper page data to the page of memory cells.

24. The method of claim 21, wherein using the information indicative of the usage of memory cells of the page of memory cells to adjust a programming voltage during the second portion of the programming operation comprises using the information indicative of the usage of memory cells of the page of memory cells to adjust an initial programming voltage for the second portion of the programming operation.

25. The method of claim 21, wherein determining information indicative of a usage of memory cells of the page of memory cells during the first portion of the programming operation and programming the information indicative of the usage of memory cells of the page of memory cells to the page of memory cells during the first portion of the programming operation comprises determining an upper limit of a resulting threshold voltage distribution for the page of memory cells following a particular programming pulse during the first portion of the programming operation, and programming data indicative of the determined upper limit of the resulting threshold voltage distribution to the page of memory cells during the first portion of the programming operation.

26. The method of claim 25, wherein determining an upper limit of a resulting threshold voltage distribution for the page of memory cells following a particular programming pulse during the first portion of the programming operation comprises determining the upper limit of the resulting threshold voltage distribution for the page of memory cells following an initial programming pulse during the first portion of the programming operation.

27. The method of claim 21, wherein using the information indicative of the usage of memory cells of the page of memory cells to adjust a programming voltage of the second portion of the programming operation comprises using the information indicative of the usage of memory cells of the page of memory cells to adjust a programming voltage of the second portion of the programming operation.

* * * * *